(12) United States Patent
Yuan et al.

(10) Patent No.: US 7,696,004 B2
(45) Date of Patent: Apr. 13, 2010

(54) WAFER LEVEL PACKAGE FABRICATION METHOD

(75) Inventors: Jingli Yuan, Gyunggi-do (KR); Jae Cheon Doh, Gyunggi-do (KR); Si Joong Yang, Gyunggi-do (KR); In Goo Kang, Gyunggi-do (KR); Seung Wook Park, Seoul (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 135 days.

(21) Appl. No.: 12/155,317

(22) Filed: Jun. 2, 2008

(65) Prior Publication Data

US 2008/0299706 A1 Dec. 4, 2008

(30) Foreign Application Priority Data

Jun. 1, 2007 (KR) .................. 10-2007-0053718

(51) Int. Cl.
*H01L 21/00* (2006.01)

(52) U.S. Cl. .................. 438/106; 438/113; 438/118; 257/E21.499; 257/E23.193

(58) Field of Classification Search .................. 438/106, 438/110, 113, 118; 257/783, E21.499, E21.506, 257/E23.193
See application file for complete search history.

(56) References Cited

U.S. PATENT DOCUMENTS

| | | | |
|---|---|---|---|
| 5,448,014 A | 9/1995 | Kong et al. | |
| 6,777,263 B1 * | 8/2004 | Gan et al. | 438/106 |
| 6,846,725 B2 * | 1/2005 | Nagarajan et al. | 438/456 |
| 7,368,808 B2 * | 5/2008 | Heck et al. | 257/678 |
| 2006/0141650 A1 | 6/2006 | Kim et al. | |
| 2008/0286904 A1 * | 11/2008 | Yuan et al. | 438/119 |

FOREIGN PATENT DOCUMENTS

| | | |
|---|---|---|
| JP | 2006-197554 | 7/2006 |
| JP | 2006-303061 | 11/2006 |
| KR | 10-2006-0074075 | 7/2006 |

* cited by examiner

*Primary Examiner*—Tuan N. Quach

(57) ABSTRACT

Provided is a wafer level package fabrication method. The method includes providing a device substrate wafer including one or more devices on an upper surface thereof, and a bonding pad electrically connected to the device, providing a bonding seal surrounding the device along the bonding pad, bonding a cap substrate wafer to the device substrate wafer through the bonding seal, the cap substrate wafer having a via formed in a region corresponding to the bonding pad, forming an external terminal on the cap substrate wafer, the external terminal being electrically connected to the bonding pad, and cutting the cap substrate wafer and the device substrate wafer along a cutting line to individually separate a plurality of wafer level packages. The method is conducive to reducing product size for miniaturization, is capable of performing a bonding process without wafer deformation or damage, and increases freedom in wafer material selection.

24 Claims, 6 Drawing Sheets

WAFER LEVEL PACKAGE FABRICATION METHOD

CROSS-REFERENCE TO RELATED APPLICATIONS

This application claims the priority of Korean Patent Application No. 2007-53718 filed on Jun. 1, 2007, in the Korean Intellectual Property Office, the disclosure of which is incorporated herein by reference.

BACKGROUND OF THE INVENTION

1. Field of the Invention

The present invention relates to a wafer level package fabrication method, and more particularly, to a wafer level package fabrication method that accommodates miniaturization through reducing product size, performs a bonding process without wafer deformation or damage, and increases freedom in material selection for wafers.

2. Description of the Related Art

In general, electronic devices such as a film bulk acoustic resonator (FBAR) and a surface acoustic wave (SAW) filter are being drastically miniaturized and are required to be highly reliable.

Today, electronic devices are being given increased functions and reduced power consumption, and due to continued industry demands for lighter, smaller devices, FBAR devices widely used in mobile phones, etc. are rapidly proliferating. Thus, chip scale packages (CSP) are gradually declining in popularity, and wafer level packages (WLP) are being pursued from many different perspectives, to realize increased yield and lower fabrication costs. Such WLPs are widely thought to be the greatest factor affecting market competitiveness.

The WLP includes a device wafer having a circuit with a miniature driver, a cap wafer coupled at the top of the device wafer, and a sidewall formed of a bonded metal line that couples the device wafer and cap wafer at perimeters thereof and seals the inner space for the driver from the external environment. The cavity (inner space) is for protecting an electrode pattern within from a harmful external environment or impurities.

Methods for fabricating WLPs are disclosed in U.S. Pat. No. 5,448,014 and Japanese Patent Publication No. 2006-197554, which are included herein in their entirety by reference.

However, in such related art methods for fabricating WLPs, deformation and fissures can occur in the device wafer and cap wafer because vertical stacking via melting fusion of the cap wafer and device wafer is performed through providing a metal bonding material on the respective undersurfaces of the cap wafer and device wafer and then applying a high level of heat ranging from approximately 200° C. to approximately 300° C., and the device wafer and cap wafer are limited to the same material or materials that have similar thermal expansion coefficients because deformation or fissure occurrence in wafers is probable when the device wafer and cap wafer are formed of materials having respectively different thermal expansion coefficients.

Also, because related art methods for fabricating WLPs have complicated processes, there are limitations in increasing yield and reducing product cost to increase price competitiveness.

Also, there is a limitation in reducing package size and furthering miniaturization, due to a requirement for a space to be provided between the device portions and the bonding metal lines, in which connection pads must be provided to electrically connect to external terminals, for inputting/outputting signals.

SUMMARY OF THE INVENTION

An aspect of the present invention provides a method for fabricating a wafer level package conducive to reducing product size for miniaturization, capable of performing a bonding process without wafer deformation or damage, and which increases freedom in wafer material selection.

According to an aspect of the present invention, there is provided a wafer level package fabrication method. The method includes providing a device substrate wafer including one or more devices on an upper surface thereof, and a bonding pad electrically connected to the device, providing a bonding seal surrounding the device along the bonding pad, bonding a cap substrate wafer to the device substrate wafer through the bonding seal, the cap substrate wafer having a via formed in a region corresponding to the bonding pad, forming an external terminal on the cap substrate wafer, the external terminal being electrically connected to the bonding pad, and cutting the cap substrate wafer and the device substrate wafer along a cutting line to individually separate a plurality of wafer level packages.

The bonding pad may include a connection pad connected to a connection pattern printed on the upper surface of the device substrate wafer such that the bonding pad is connected to the device, and a conductive bump mounted on an upper surface of the connection pad.

The bonding seal may be continuously formed along the bonding pad to fully cover the bonding pad with a non-conductive material.

The sealing line may be continuously formed along the bonding pad to cover an outside surface of the bonding pad with a non-conductive material and expose only an upper surface of the bonding pad.

The via may be formed in the cap substrate wafer to correspond to the bonding pad after the cap substrate wafer is bonded to the device substrate wafer.

The via may be formed in the cap substrate wafer to correspond to the bonding pad before the cap substrate wafer is bonded to the device substrate wafer.

The cap substrate wafer bonded to the device substrate wafer through the bonding seal may be thinned by removing an upper surface thereof using one of lapping, grinding and polishing.

The bonding of the cap substrate wafer to the device substrate wafer may further include exposing an upper surface of the bonding pad by removing the bonding seal exposed through the via.

The forming of the external terminal may include filling the via with a conductive filler, and forming a terminal pad on the cap substrate wafer, the terminal pad being connected to an upper end of the conductive filler.

The cutting line may be positioned outside the external terminal and the bonding seal or positioned along the center of the external terminal and the bonding seal.

An external bonding seal may further be formed between the cap substrate wafer and the device substrate wafer, and is formed outside the bonding seal such that it is spaced apart from the bonding seal by a predetermined distance.

The external bonding seal may include an upper bonding material formed on an undersurface of the cap substrate wafer and a lower bonding material formed on an upper surface of the device substrate wafer, the upper and lower bonding materials being integrally bonded when the cap substrate wafer is bonded to the device substrate wafer.

The upper and lower bonding materials may be formed of a non-conductive material.

The cutting line may be positioned outside the external bonding seal or positioned along the center of the external bonding seal.

According to another aspect of the present invention, there is provided a wafer level package fabrication method, including providing a cap substrate wafer including an upper bonding material surrounding a pad bonding material, the upper bonding material and the pad bonding material being formed on an undersurface of the cap substrate wafer, providing a device substrate wafer including a lower bonding material that surrounds a bonding pad on an upper surface thereof corresponding to the pad bonding material, and including a device electrically connected to the bonding pad, bonding a cap substrate wafer to the device substrate wafer through the pad bonding material and the upper and lower bonding materials, the cap substrate wafer having a via formed in a region corresponding to the bonding pad, forming an external terminal on the cap substrate wafer, the external terminal being electrically connected to the bonding pad, and cutting the cap substrate wafer and the device substrate wafer along a cutting line to individually separate a plurality of wafer level packages.

The bonding pad may include a connection pad connected to a connection pattern printed on the upper surface of the device substrate wafer such that the bonding pad is connected to the device, and a conductive bump mounted on an upper surface of the connection pad.

The bonding pad may include an auxiliary bonding material on an upper end thereof, the auxiliary bonding material facing the pad bonding material.

The pad bonding material and the auxiliary bonding material may be formed of a non-conductive material.

The via may be formed in the cap substrate wafer to correspond to the bonding pad after the cap substrate wafer is bonded to the device substrate wafer.

The via may be formed to penetrate the pad bonding material.

The via may be formed in the cap substrate wafer to correspond to the bonding pad before the cap substrate wafer is bonded to the device substrate wafer.

The cap substrate wafer bonded to the device substrate wafer through the bonding seal may be thinned by removing an upper surface thereof using one of lapping, grinding and polishing.

The forming of the external terminal may include filling the via with a conductive filler, and forming a terminal pad on the cap substrate wafer, the terminal pad being connected to an upper end of the conductive filler.

The cutting line may be positioned outside an external bonding seal formed by bonding the upper and lower bonding materials to each other, or positioned along the center of the external bonding seal.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 1A:
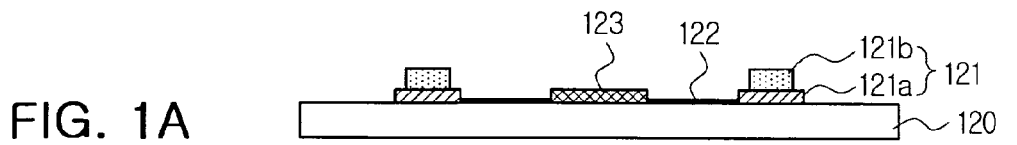
FIGS. 1(a), 1(b), 1(c), 1(d), 1(e), 1(f) sequentially illustrate a wafer level package fabrication method according to a first embodiment of the present invention.

To fabricate a wafer level package (WLP) 100 according to an embodiment of the present invention, a wafer 120 made of silicon or glass for a device substrate is first provided, as shown in FIG. 1(a).

The device substrate wafer 120 is a circular plate with a thickness of approximately 1000 µm, one or more of a device 123 is provided on the upper surface of the device substrate wafer 120, and the device 123 is electrically connected through a connection pattern 122 to bonding pads 121 provided on the upper surface of the device substrate wafer 120.

Here, the bonding pads 121 respectively include a contact pad 121a contacting the connection pattern 122 patterned and printed on the upper surface of the device substrate wafer 120, and a conductive bump 121b mounted on the upper surface of the contact pad 121a.

The device 123 may be a driving circuit patterned and printed on the upper surface of the device substrate wafer 120 to electrically connect with the bonding pads 121, and may be provided as a semiconductor chip such as a bare die mounted on the upper surface of the device substrate wafer.

Figure 1B:
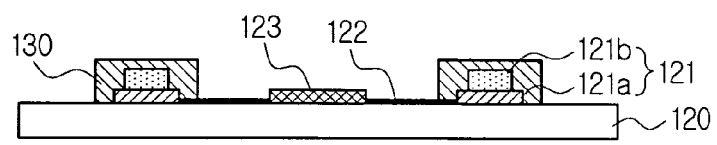
Figure 2A:
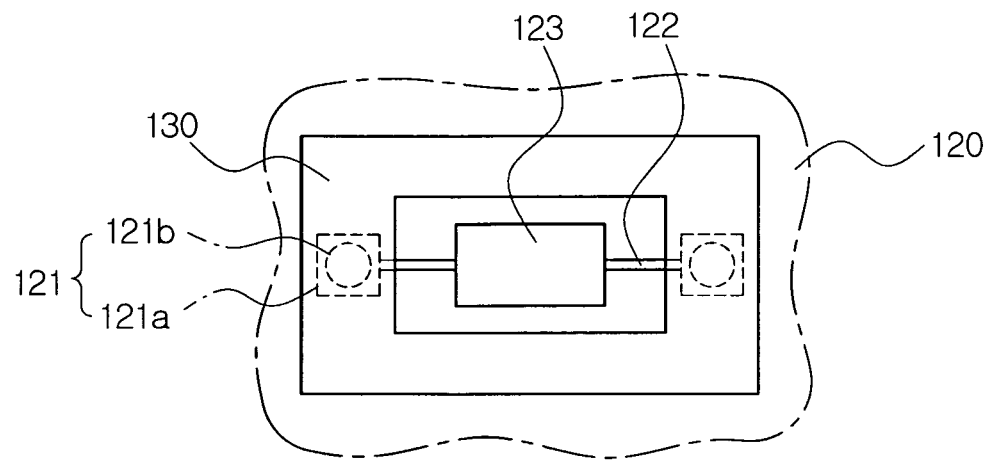
FIGS. 2(a), 2(b), 2(c) are plan views illustrating the wafer level package fabrication method according to the first embodiment of the present invention.

As illustrated in FIGS. 1(b) and 2(a), the device substrate wafer 120 includes a bonding seal 130, and the bonding seal 130 is a sealing line continuously formed along the bonding pad 121 to enclose the device 123.

Here, the bonding seal 130 may be formed of a non-conductive material formed continually along the bonding pad 120 to either completely cover the bonding pad 121 or cover the outer periphery of the bonding pad 121 while exposing only the upper surface of the bonding pad 121.

The bonding seal 130 may be formed of a non-conductive material such as epoxy.

Figure 1C:
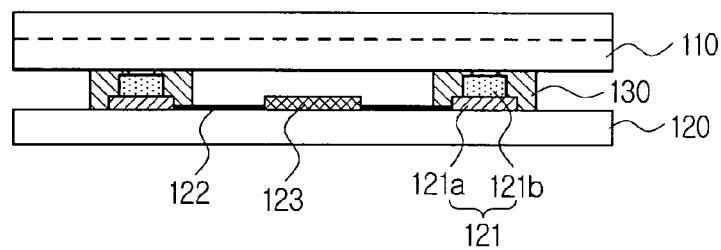
Figure 1D:
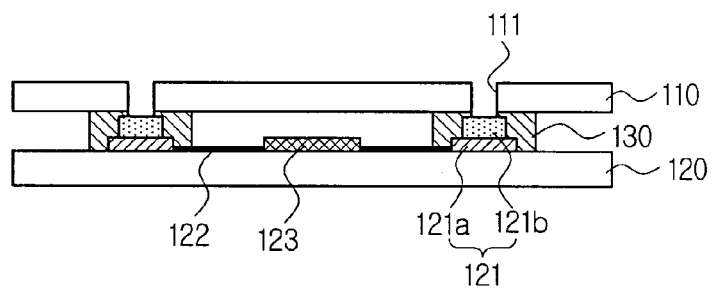
Figure 1E:
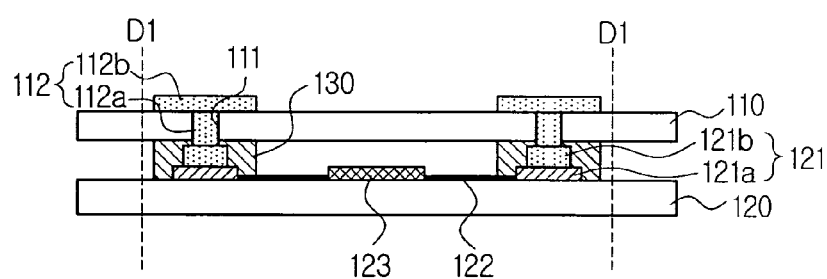
Figure 1F:
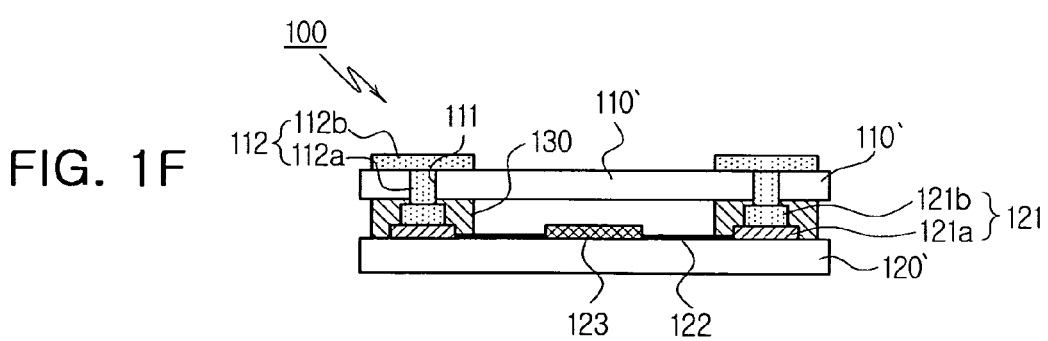
Figure 2B:
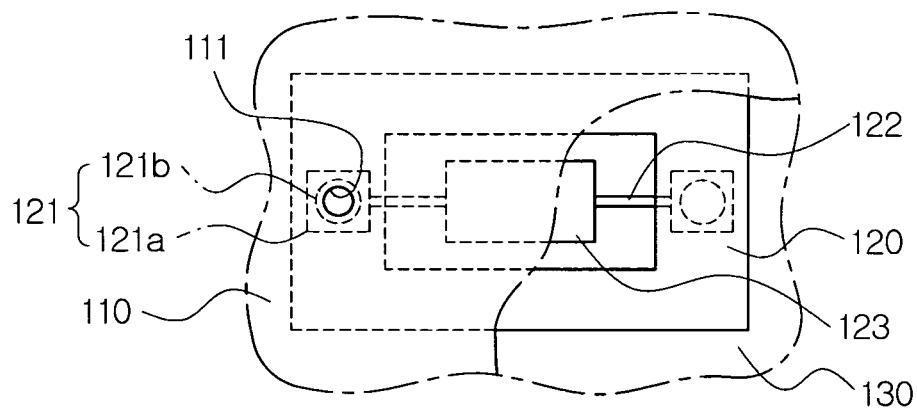
Figure 2C:
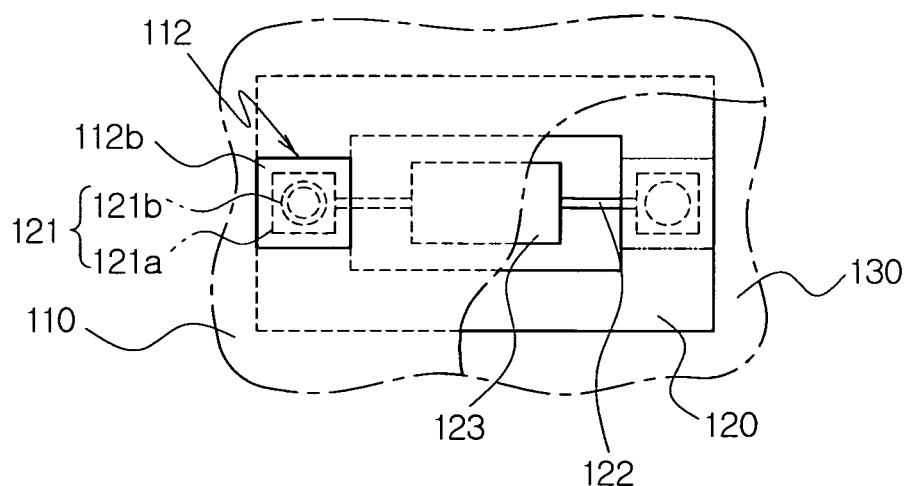

Next, as shown in FIGS. 1(c) and 2(b), the device substrate wafer 120, having the bonding pad 121, the device 123, and the bonding seal 130, is positioned facing the cap substrate wafer 110 with the bonding seal 130 therebetween, contacted to the undersurface of the cap, and the upper end of the bonding seal 130 is contacted with the undersurface of the cap substrate wafer 110 to perform vertical bonding.

In this state, temperature in a range of approximately 80° to approximately 100° is applied to melt and bond the bonding seal 130 and bond the cap substrate wafer 110 and the device substrate wafer 120.

Here, while the cap substrate wafer 110 may be formed of the same material as the device substrate wafer 120, it is not limited thereto, and may be formed of a material with a different thermal expansion coefficient.

Next, one method from lapping, grinding, and polishing may be used to remove and thin the cap substrate wafer 110 to the level of the dotted line in FIG. 1(*c*) from the upper surface thereof, thereby reducing the overall thickness of the package and enabling compacting of the package.

As illustrated in FIG. 1(*d*), the thinned cap substrate wafer 110 may define vias 111 therethrough corresponding in number to the bonding pads 121, and the inner diameter of the via 111 may be less than the outer diameter of the bonding pad 121.

Here, although the via 111 has been described as being formed through the cap substrate wafer 110 in a number corresponding to that of the bonding pads 121 after the cap substrate wafer 110 and the device substrate waver 120 are bonded, the vias 111 may be formed through the cap substrate wafer 110 in a number corresponding to that of the bonding pads 121 before the cap substrate wafer 110 and the device substrate wafer 120 are bonded.

The vias 111 defined in the cap substrate wafer 10 may be defined through dry etching such as a reactive ion etch (REI) or through wet etching employing an etch liquid.

A sealing space that completely blocks the device 123 from the external environment is formed between the vertically bonded cap substrate wafer 110 and the device substrate wafer 120, with the bonding seal 130 in between.

Also, with the device substrate wafer 120 and the cap substrate wafer 110 in a mutually bonded state, as the upper surface of the bonding pad 121 must be exposed to the outside, by removing the bonding seal 130 exposed to the outside through the via 111, the upper surface of the bonding pad 121 is exposed to the outside through the via 111.

Here, in the case where the bonding seal 130 is formed on the device substrate wafer 120 to expose only the upper surface of the bonding pad 121 to the outside, because the upper surface of the bonding pad 121 is exposed to the outside through the via 111, the process of removing the bonding seal 130 is not needed. On the other hand, in the case where the bonding seal 130 is formed on the device substrate wafer 120 to cover the entire bonding pad 121, a process of removing a portion of the bonding seal 130 to expose the upper surface of the bonding pad 121 to the outside through the via 111 is required.

Next, Referring to FIGS. 1(*e*) and 2(*c*), an external terminal 112 electrically connecting the bonding pad 121 connected to the device 123 is formed on the cap substrate wafer 110.

The external terminal 112 includes a terminal pad 112*b* connected to an upper end of a conductive filler 112*a* is formed on the upper surface of the cap substrate wafer 110, after the conductive filler 112*a* has been filled in the via 111 of the cap substrate wafer 110.

Thus, a conductive bump 121*b* of the bonding pad 121 connected to the device 123 through the connection pattern 122 is electrically connected to the external terminal 112 formed of the conductive filler 112*a* and the terminal pad 112*b*.

Next, the vertically bonded cap substrate wafer 110 and device substrate wafer 120, with the bonding seal 130 therebetween, are cut along the dotted lines D1 in FIG. 1(*e*) to yield a plurality of separate wafer level packages 100.

Also, while the dotted line D1 may be formed along the outside of external terminal 112 and bonding seal 130, it is not limited thereto, and may be formed along the center of the bonding seal 130 to include the via 111.

Here, because the wafer level package 100 has the via and bonding pad overlapped with the bonding seal 130 bonded between a substrate 110' and device substrate 120', the width of the package can be reduced, enabling product miniaturization.

A method of fabricating a WLP 200 according to another embodiment of the present invention first involves providing a cap substrate wafer 210 made of silicon or glass, as shown in FIG. 3(*a*), and providing an upper bonding material 131 continuously along the lower surface of the cap substrate wafer 210.

Referring to FIG. 3(*b*), a device substrate wafer 220 is provided, one or more of a device 223 is provided on the upper surface of the device substrate wafer 220, and the device 223 is electrically connected to the bonding pad 221 through a connection pattern 222.

Here, the bonding pad 221, as in the previous embodiment, includes a contact pad 221*a* contacting the connection pattern 222 patterned and printed on the upper surface of the device substrate wafer 220, and a conductive bump 221*b* mounted on the upper surface of the contact pad 221.

An upper bonding material 231 is formed on the undersurface of the cap substrate wafer 210, and a lower bonding material 232 is provided continually on the upper surface of the device substrate wafer 220 opposite the upper bonding material 231.

Here, a bonding seal 230 may be formed of a non-conductive material such as epoxy, and upper and lower bonding materials 231 and 232 may be formed of a non-conductive material as well.

Referring to FIGS. 3(*c*) and 4(*a*), the bonding seal 230 is formed continually along the bonding pad 221 on the upper portion of the device substrate wafer 210 to enclose the device 223 as in the previous embodiment.

Next, as illustrated in FIGS. 3(*d*) and 2(*b*), the device substrate wafer 220 having the bonding pad 221, device 223, and bonding seal 230, is disposed in vertical contact with the cap substrate wafer 210, with the lower bonding material 232 in contact with and facing the upper bonding material 231 of the cap substrate wafer 210, and the bonding seal 230 simultaneously interposed in between.

In this state, by applying heat of approximately 80° to approximately 100° to the bonding seal 230, the upper and lower bonding materials 231 and 232 are integrally bonded to form a external bonding seal 233, and the bonding seal 230 is melted to vertically bond the cap substrate wafer 210 and the device substrate wafer 220.

Next, via 211 are defined in regions of the cap substrate wafer 210 to face the bonding pads 221 one-on-one.

Here, as in the previous embodiment, the vias 211 formed in the cap substrate wafer 210 may be formed after the bonding of the cap substrate wafer 210 and the device substrate wafer 220; however, they are not limited thereto, and the vias 211 may be formed after the cap substrate wafer 210 and the device substrate wafer 220 are bonded.

As described above, a sealing space that completely blocks the device 223 from the external environment is formed between the vertically bonded cap substrate wafer 210 and the device substrate wafer 220, through the bonding seal 230 and external bonding seal 233.

Simultaneously, as illustrated in FIG. 3(*e*), one method from lapping, grinding, and polishing may be used to remove the cap substrate wafer 210, to reduce wafer thickness and facilitating package miniaturization.

Next, with reference to FIGS. 3(*f*) and 4(*c*), an external terminal 212 electrically connected to the bonding pad 221 connected to the device 223 is formed on the cap substrate wafer 210.

After a conductive filler 212a is filled in the via 211 of the cap substrate wafer 210, the external terminal 212 is formed on the upper surface of the cap substrate wafer 210, with a terminal pad 212b contacting the upper end of the conductive filler 212a.

Figure 3A:
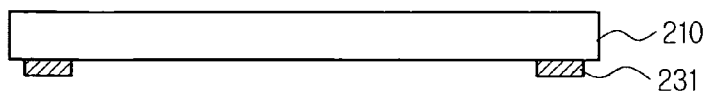
FIGS. 3(a), 3(b), 3(c), 3(d), 3(e), 3(f), 3(g) sequentially illustrate a wafer level package fabrication method according to a second embodiment of the present invention.
Figure 3B:
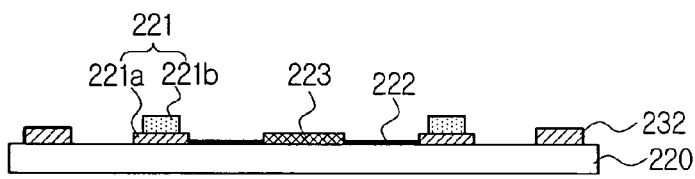
Figure 3C:
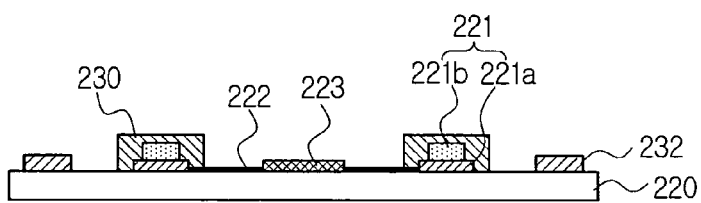
Figure 3D:
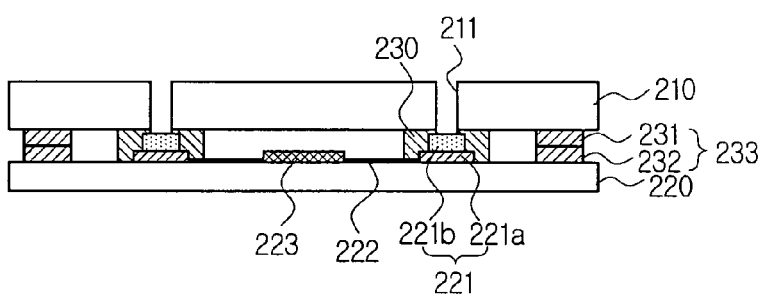
Figure 3E:
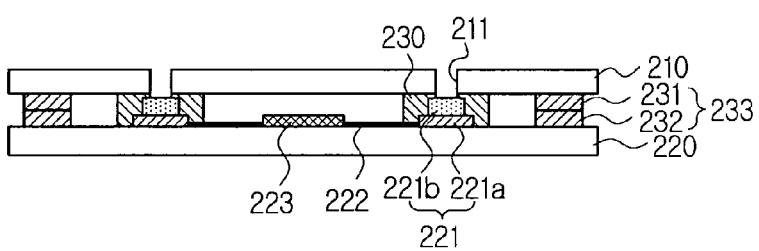
Figure 3F:
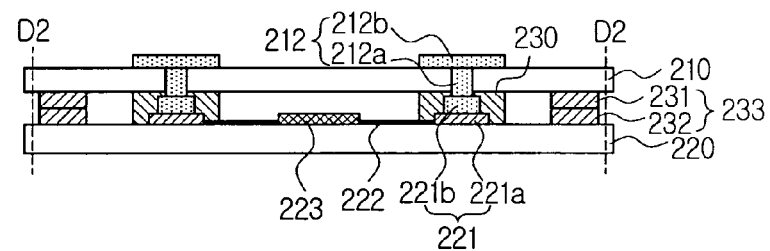
Figure 3G:
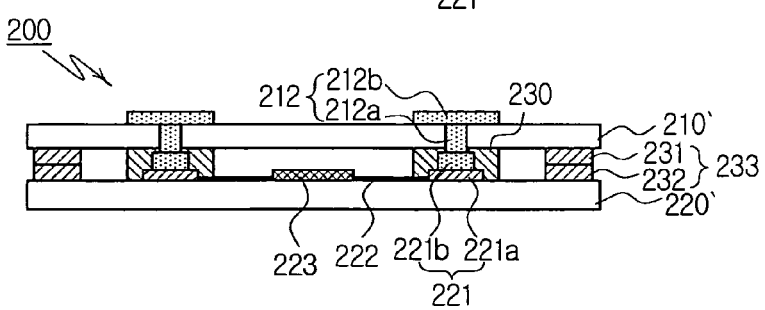
Figure 4A:
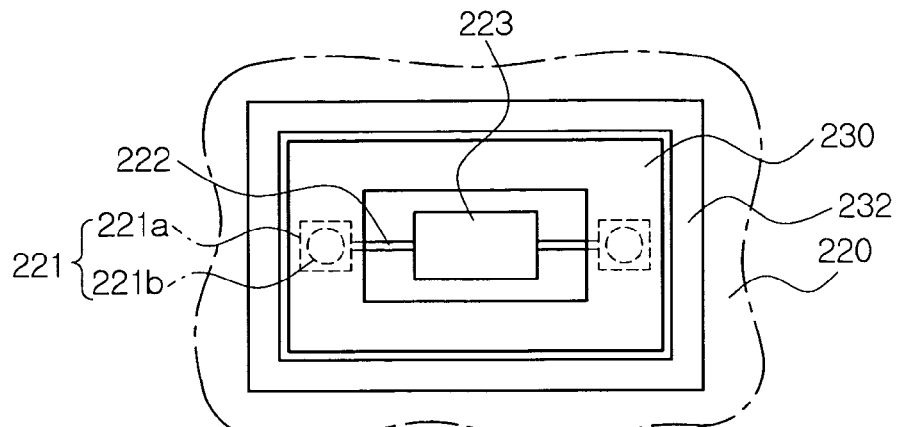
FIGS. 4(a), 4(b), 4(c) are plan views illustrating the wafer level package fabrication method according to the second embodiment of the present invention.
Figure 4B:
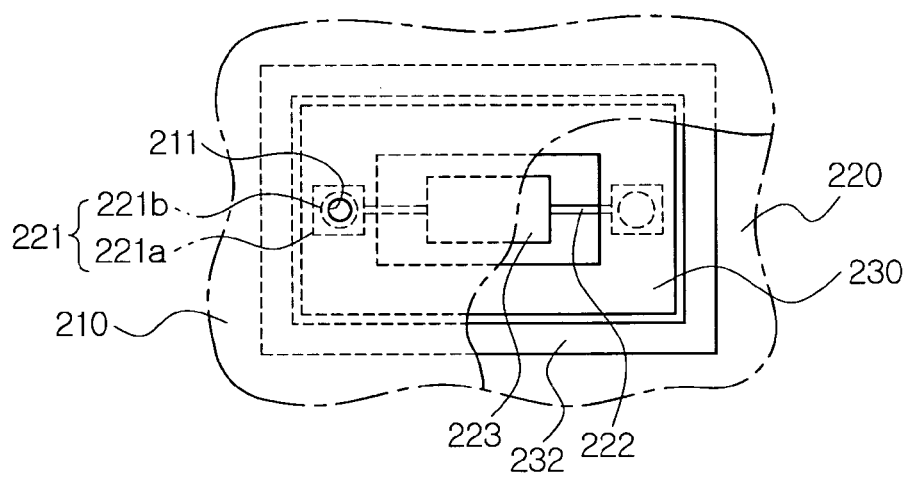
Figure 4C:
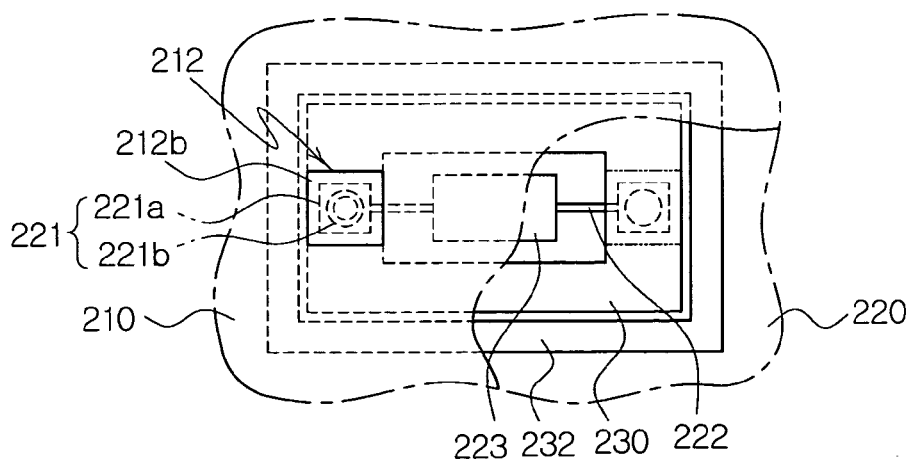

Next, the cap substrate wafer 210 bonded with the device substrate wafer 220, and the bonding seal 230 and external bonding seal 233 therebetween, are cut along dotted line D2 in FIG. 3(f), to yield a plurality of separate wafer level packages 200.

Here, while the dotted line D2 is shown formed along the outside of the bonding seal 230, it is not limited thereto, and may alternatively be formed along the center of the external bonding seal 233 at a predetermined distance from the outside of the bonding seal 230.

Figure 5A:
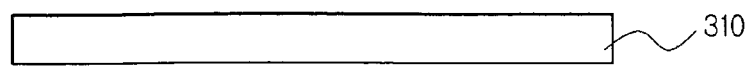
FIGS. 5(a), 5(b), 5(c), 5(d), 5(e), 5(f), 5(g) sequentially illustrate a wafer level package fabrication method according to a third embodiment of the present invention.
Figure 5B:
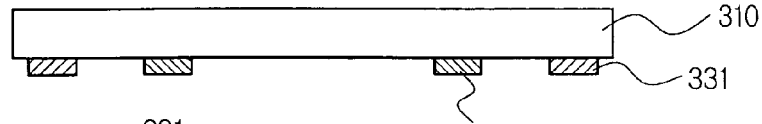

In a method for fabricating a wafer level package 300 according to a still further embodiment of the present invention, as illustrated in FIGS. 5(a) and 5(b), first, a cap substrate wafer 310 formed of silicon or glass is provided, a plurality of pad bonding materials 330 is provided at the undersurface of the cap substrate wafer 310, and an upper bonding material 331 enclosing the pad bonding material 330 is provided.

Figure 5C:
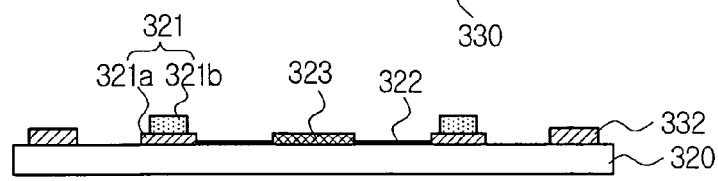

Referring to FIG. 5(c), a device substrate wafer 320 is provided, one or more of a device 323 is provided on the upper surface of the device substrate wafer 320, and the device 323 is electrically connected to the bonding pad 321 through a connection pattern 322.

Here, the bonding pad 321, as in the previous embodiments, includes a contact pad 321a connected with the connection pattern 322 patterned and printed on the upper surface of the device substrate wafer 320, and a conductive bump 321b mounted on the upper surface of the contact pad 321a.

Also, a lower bonding material 331 is provided continuously to enclose the bonding pad 321 on the upper surface of the device substrate wafer 320 facing an upper bonding material 331 formed on the undersurface of the cap substrate wafer 310.

Figure 5D:
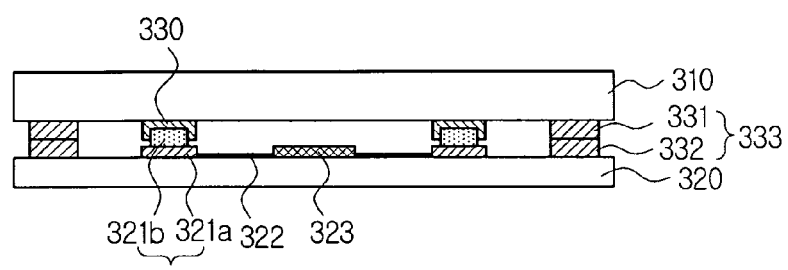

Next, the device substrate wafer 320 with the bonding pad 321, device 323, and lower bonding material 332, as illustrated in FIG. 5(d), is disposed such that the lower bonding material 332 formed on the upper surface thereof faces and is in contact with the upper bonding material 331 of the cap substrate wafer, and the lower end of the pad bonding material 330 is simultaneously disposed in contact opposite the upper end of the bonding pad 321.

In this state, heat ranging from approximately 80° to approximately 100° is applied to the contacting portions of the upper and lower bonding materials 331 and 332 and the pad bonding material 330, to integrally bond the upper and lower bonding materials 331 and 332 and form a external bonding seal 333.

At the same time, the pad bonding material 320 contacting the conductive bump 321b of the bonding pad 321 is used to vertically bond the cap substrate wafer 310 and the device substrate wafer 320.

Figure 5E:
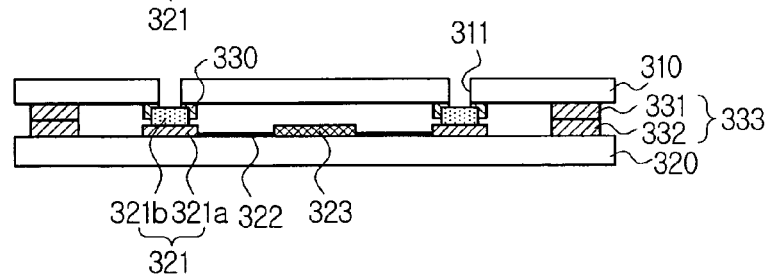

Next, referring to FIG. 5(e), dry etching or wet etching is employed to form a via 311 through a region of the cap substrate wafer 310 corresponding one-to-one with pad bonding material 320 and the bonding pad 321.

Here, the via 311 formed in the cap substrate wafer 310 may be formed after the cap substrate wafer 310 and the device substrate wafer 320 have been bonded.

The via 311 is formed through the cap substrate wafer 310 and the pad bonding material 330 to expose conductive bump 321b of the bonding pad 321 to the outside.

As described above, a sealing space, that completely seals the device 323 from the outside environment, is formed between the vertically bonded cap substrate wafer 310 and the device substrate wafer 320 through the pad bonding material 330 and the external bonding seal 333 therebetween.

At the same time, the cap substrate wafer 310, as illustrate in FIG. 5(e), is reduced in wafer thickness through partial removal using one method from lapping, grinding, and polishing, to thus enable package miniaturization.

Figure 5F:
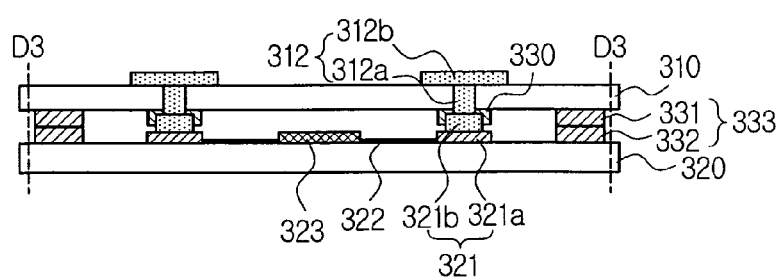

Next, with reference to FIG. 5(f), an external terminal 312 is formed on the cap substrate wafer 310 to be electrically connected to the bond pad 321 contacting the device 323.

After a conductive filler 312a is filled in the via 311 of the cap substrate wafer 310, the external terminal 312 is formed on the upper surface of the cap substrate wafer 310, with a terminal pad 312b connected to the upper end of the conductive filler 312a.

Next, the vertically bonded cap substrate wafer 310 and the device substrate wafer 320, with the pad bonding material 330 and the external bonding seal 333 in between, are cut along an imaginary dotted line D3 to yield a plurality of separate wafer level packages 300, as illustrated in FIG. 5(f).

Here, while the dotted line D3 may be formed along the outside of the external bonding seal 333, it is not limited thereto, and may alternatively be formed along the center of the external bonding seal 333 at a predetermined distance from the outside of the bonding pad 321.

Figure 5G:
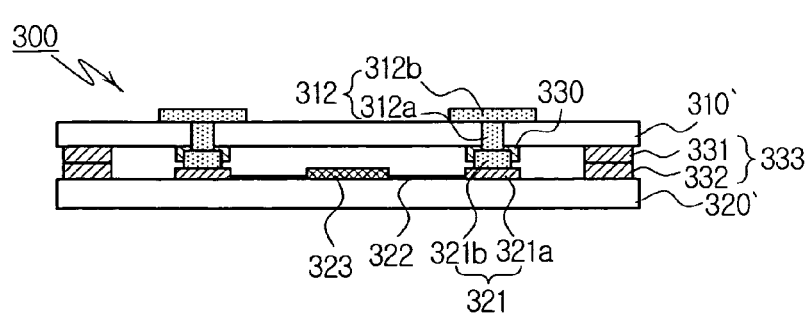

Accordingly, with reference to FIG. 5(g), a cap substrate 310' and device substrate 320' can complete the fabrication of the wafer level package 300, through the pad bonding material 330 and the external bonding seal 333, the external terminal 312 provided on the cap substrate 310' contacts the bonding pad 321 provided on the device substrate 320', and the bonding pad 321 is electrically connected to the device 323 through the connection pattern 322.

To fabricate a wafer level package (WLP) 400 according to yet another embodiment of the present invention, a cap substrate wafer 410 made of silicon or glass is first provided, as illustrated in FIGS. 1(a) and 1(b). On an undersurface of the cap substrate wafer 410, a plurality of pad bonding materials 430a is formed, and an upper bonding material 431 is also formed to surround the pad bonding material 430a.

A via 411 is formed in the cap substrate wafer 410 corresponding to the pad bonding material 430a such that it penetrates the cap substrate wafer 410 and the pad bonding material 430a.

Figure 6A:
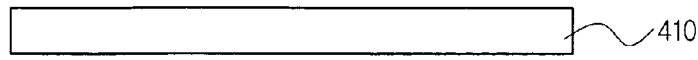
FIGS. 6(a), 6(b), 6(c), 6(d), 6(e), 6(f), 6(g) sequentially illustrate a wafer level package fabrication method according to a fourth embodiment of the present invention.
Figure 6B:
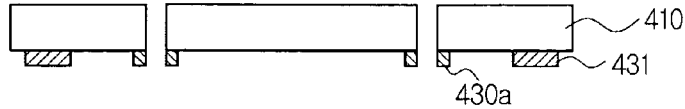
Figure 6C:
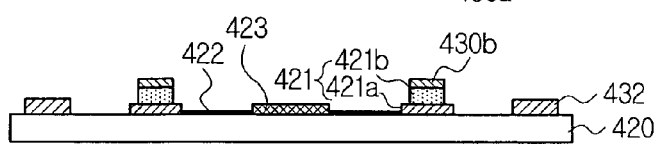

Referring to FIG. 6C, a device substrate wafer 420 is provided, and one or more devices 423 is/are provided on the upper surface of the device substrate wafer 420. The device 423 is electrically connected to a bonding pad 421 through a connection pattern 422.

Similarly to the foregoing embodiments, the bonding pad 421 includes a connection pad 421a connected to the connection pattern printed on the upper surface of the device substrate wafer 420, and a conductive bump 421b mounted on an upper surface of the connection pad 421a.

On an upper end of the bonding pad 421, an auxiliary bonding material 430b may be formed, which allows a bonding part 430 to be formed through fusion bonding with the pad bonding material 430a.

A lower bonding material 432 surrounding the bonding pad 421 is formed in a region of the upper surface of the device substrate wafer 420 corresponding to the upper bonding material 431 formed on the undersurface of the cap substrate wafer 410.

Figure 6D:
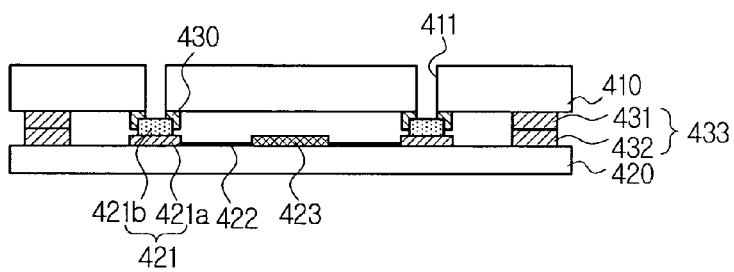

Subsequently, referring to FIG. 6(d), the device substrate wafer 420 including the device 423 is bonded to the cap substrate wafer 410 such that the lower bonding material 432 is correspondingly bonded to the upper bonding material 431, and simultaneously the pad bonding material 430a, through which the via 411 passes, is correspondingly bonded to the auxiliary bonding material 430b of the bonding pad 421.

In this state, when temperature in a range of approximately 80° to approximately 100° is applied to a contact between the upper and lower bonding materials 431 and 432 and a contact point between the pad bonding material 430a and the auxiliary bonding material 430b, the upper and lower bonding materials 431 and 432 are integrally bonded to form an external bonding seal 433, and the pad bonding material 430a and the auxiliary bonding material 430b are integrally bonded to form the bonding part 430. Accordingly, the cap substrate wafer 410 and the device substrate wafer 420 are vertically bonded.

The via 411 formed in the cap substrate wafer 410 exposes the conductive bump 421b of the bonding pad 421.

A sealing space allowing the device 423 to be perfectly sealed off from an external environment, is formed between the cap substrate wafer 410 and the device substrate wafer 420 bonded to each other by means of the bonding part 430 and the external bonding seal.

Figure 6E:
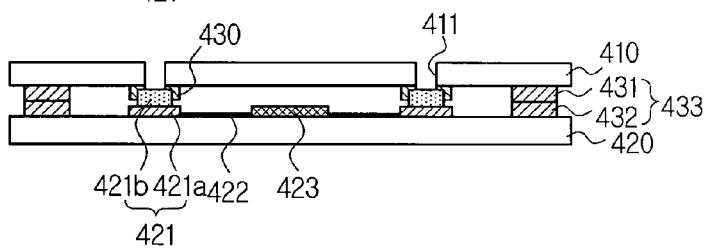

At the same time, referring to FIG. 6(e), the cap substrate wafer 410 is thinned by removing the upper surface using one of lapping, grinding and polishing, thus making it possible to realize a small-sized package.

Figure 6F:
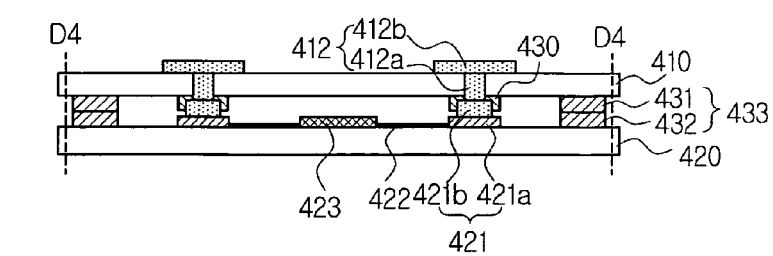

Thereafter, referring to FIG. 6(f), an external terminal 412, which is electrically connected to the bonding pad 421 connected to the device 423, is formed on the cap substrate wafer 410.

The external terminal 412 is formed in such a way that a conductive filler 412a is filled into the via 411 of the cap substrate wafer 410, and then a terminal pad 412b connected to an upper end of the conductive filler 412a is formed on the upper surface of the cap substrate wafer 410.

Next, the bonded cap substrate wafer 410 and the device substrate wafer 420, with the bonding part 430 and external bonding seal 433 therebetween, are cut along the dotted line D4 in FIG. 6(f), yielding a plurality of separate wafer level packages 400.

Here, while the dotted line D4 is depicted as being formed along the outside of the external bonding seal 433, it is not limited thereto, and may alternatively be formed along the middle of the external bonding seal 433 at a predetermined distance apart from the outside of the bonding pad 421.

Figure 6G:
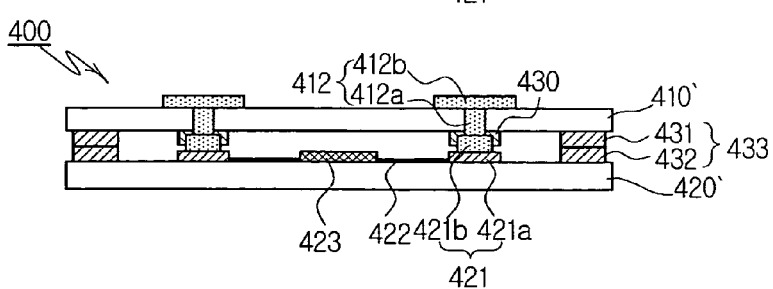

Accordingly, with reference to FIG. 6(g), the cap substrate 410' and device substrate 420' can form a completely fabricated wafer level package 400 with the pad bonding material 430 and bonding seal 433 therebetween, the external terminal 412 provided on the cap substrate 410' is connected to the bonding pad 421 provided on the device substrate 420', and the bonding pad 421 is electrically connected to the device 423 through the connection pattern 422.

As described above, in the present invention, a bonding pad electrically connected to an external terminal is bonded to a bonding seal that vertically bonds the cap substrate to the device substrate, a bonding material that melts at low temperature is used to vertically bond the cap substrate to the device substrate, so that the package width can be reduced compared to that of the related art, thereby resulting in the ability to miniaturize dimensions of set products employing a package, raising process yield through preventing wafer deformation and other damage, and offering increased freedom in choosing wafer materials.

While the present invention has been shown and described in connection with the exemplary embodiments, it will be apparent to those skilled in the art that modifications and variations can be made without departing from the spirit and scope of the invention as defined by the appended claims.

What is claimed is:

1. A wafer level package fabrication method, comprising:
   providing a device substrate wafer comprising one or more devices on an upper surface thereof, and a bonding pad electrically connected to the device;
   providing a bonding seal surrounding the device along the bonding pad;
   bonding a cap substrate wafer to the device substrate wafer through the bonding seal, the cap substrate wafer having a via formed in a region corresponding to the bonding pad;
   forming an external terminal on the cap substrate wafer, the external terminal being electrically connected to the bonding pad; and
   cutting the cap substrate wafer and the device substrate wafer along a cutting line to individually separate a plurality of wafer level packages.

2. The method of claim 1, wherein the bonding pad comprises a connection pad connected to a connection pattern printed on the upper surface of the device substrate wafer such that the bonding pad is connected to the device, and a conductive bump mounted on an upper surface of the connection pad.

3. The method of claim 1, wherein the bonding seal is continuously formed along the bonding pad to fully cover the bonding pad with a non-conductive material.

4. The method of claim 1, wherein the sealing line is continuously formed along the bonding pad to cover an outside surface of the bonding pad with a non-conductive material and expose only an upper surface of the bonding pad.

5. The method of claim 1, wherein the via is formed in the cap substrate wafer to correspond to the bonding pad after the cap substrate wafer is bonded to the device substrate wafer.

6. The method of claim 1, wherein the via is formed in the cap substrate wafer to correspond to the bonding pad before the cap substrate wafer is bonded to the device substrate wafer.

7. The method of claim 1, wherein the cap substrate wafer bonded to the device substrate wafer through the bonding seal is thinned by removing an upper surface thereof using one of lapping, grinding and polishing.

8. The method of claim 1, wherein the bonding of the cap substrate wafer to the device substrate wafer further comprises exposing an upper surface of the bonding pad by removing the bonding seal exposed through the via.

9. The method of claim 1, wherein the forming of the external terminal comprises:
   filling the via with a conductive filler; and
   forming a terminal pad on the cap substrate wafer, the terminal pad being connected to an upper end of the conductive filler.

10. The method of claim 1, wherein the cutting line is positioned outside the external terminal and the bonding seal or positioned along the center of the external terminal and the bonding seal.

11. The method of claim 1, wherein an external bonding seal is further formed between the cap substrate wafer and the device substrate wafer, and is formed outside the bonding seal such that it is spaced apart from the bonding seal by a predetermined distance.

12. The method of claim 11, wherein the external bonding seal comprises an upper bonding material formed on an undersurface of the cap substrate wafer and a lower bonding material formed on an upper surface of the device substrate wafer, the upper and lower bonding materials being integrally bonded when the cap substrate wafer is bonded to the device substrate wafer.

13. The method of claim 12, wherein the upper and lower bonding materials are formed of a non-conductive material.

14. The method of claim 11, wherein the cutting line is positioned outside the external bonding seal or positioned along the center of the external bonding seal.

15. A wafer level package fabrication method, comprising:
providing a cap substrate wafer comprising an upper bonding material surrounding a pad bonding material, the upper bonding material and the pad bonding material being formed on an undersurface of the cap substrate wafer;
providing a device substrate wafer comprising a lower bonding material that surrounds a bonding pad on an upper surface thereof corresponding to the pad bonding material, and comprising a device electrically connected to the bonding pad;
bonding the cap substrate wafer to the device substrate wafer through the pad bonding material and the upper and lower bonding materials, the cap substrate wafer having a via formed in a region corresponding to the bonding pad;
forming an external terminal on the cap substrate wafer, the external terminal being electrically connected to the bonding pad; and
cutting the cap substrate wafer and the device substrate wafer along a cutting line to individually separate a plurality of wafer level packages.

16. The method of claim 15, wherein the bonding pad comprises a connection pad connected to a connection pattern printed on the upper surface of the device substrate wafer such that the bonding pad is connected to the device, and a conductive bump mounted on an upper surface of the connection pad.

17. The method of claim 15, wherein the bonding pad comprises an auxiliary bonding material on an upper end thereof, the auxiliary bonding material facing the pad bonding material.

18. The method of claim 17, wherein the pad bonding material and the auxiliary bonding material are formed of a non-conductive material.

19. The method of claim 15, wherein the via is formed in the cap substrate wafer to correspond to the bonding pad after the cap substrate wafer is bonded to the device substrate wafer.

20. The method of claim 15, wherein the via is formed to penetrate the pad bonding material.

21. The method of claim 15, wherein the via is formed in the cap substrate wafer to correspond to the bonding pad before the cap substrate wafer is bonded to the device substrate wafer.

22. The method of claim 15, wherein the cap substrate wafer bonded to the device substrate wafer through the bonding seal is thinned by removing an upper surface thereof using one of lapping, grinding and polishing.

23. The method of claim 15, wherein the forming of the external terminal comprises:
filling the via with a conductive filler; and
forming a terminal pad on the cap substrate wafer, the terminal pad being connected to an upper end of the conductive filler.

24. The method of claim 15, wherein the cutting line is positioned outside an external bonding seal formed by bonding the upper and lower bonding materials to each other, or positioned along the center of the external bonding seal.

* * * * *